(12) United States Patent
Ota et al.

(10) Patent No.: US 8,421,236 B2
(45) Date of Patent: Apr. 16, 2013

(54) SEMICONDUCTOR DEVICE

(75) Inventors: Yukitoshi Ota, Osaka (JP); Hiroshige Hirano, Nara (JP); Yutaka Itou, Kyoto (JP)

(73) Assignee: Panasonic Corporation, Osaka (JP)

( * ) Notice: Subject to any disclaimer, the term of this patent is extended or adjusted under 35 U.S.C. 154(b) by 32 days.

(21) Appl. No.: 12/976,618

(22) Filed: Dec. 22, 2010

(65) Prior Publication Data

US 2011/0175232 A1 Jul. 21, 2011

(30) Foreign Application Priority Data

Jan. 15, 2010 (JP) ................................. 2010-006732

(51) Int. Cl.
*H01L 23/48* (2006.01)
(52) U.S. Cl. .................. 257/774; 257/758; 257/E23.011
(58) Field of Classification Search .................. 257/774, 257/E23.011, 258
See application file for complete search history.

(56) References Cited

U.S. PATENT DOCUMENTS

| | | |
|---|---|---|
| 2002/0179991 A1 | 12/2002 | Varrot et al. |
| 2005/0082577 A1 | 4/2005 | Usui |
| 2006/0125118 A1 | 6/2006 | Yamazaki |
| 2006/0267222 A1 | 11/2006 | Saito |
| 2010/0090344 A1 | 4/2010 | Ota et al. |

FOREIGN PATENT DOCUMENTS

| | | |
|---|---|---|
| JP | 2005-142553 | 6/2005 |
| JP | 2005-327913 | 11/2005 |

*Primary Examiner* — Tran Tran
(74) *Attorney, Agent, or Firm* — McDermott Will & Emery LLP

(57) ABSTRACT

A semiconductor device includes an electrode pad formed above a semiconductor substrate, and being a connecting portion for an external electrical connection; a multilayer body including a plurality of first interconnect layers formed in a plurality of insulating films stacked between the semiconductor substrate and the connecting portion and including an upper interconnect connected to the connecting portion, and a via configured to connect the first interconnect layers; a ring body formed in the plurality of insulating films to surround the multilayer body without interposing space, and including a plurality of second interconnect layers and at least one line via linearly connecting the second interconnect layers; and a lead line electrically connecting the connecting portion to an internal circuit. The multilayer body is connected to the ring body by at least one of the plurality of first interconnect layers. The lead line is connected to the ring body.

16 Claims, 15 Drawing Sheets

SEMICONDUCTOR DEVICE

CROSS-REFERENCE TO RELATED APPLICATION

This application claims priority to Japanese Patent Application No. 2010-6732 filed on Jan. 15, 2010, the disclosure of which including the specification, the drawings, and the claims is hereby incorporated by reference in its entirety.

BACKGROUND

The present disclosure relates to semiconductor devices, and more particularly to semiconductor devices having electrode pads.

In recent years, in order to reduce parasitic capacitance caused by an increase in density of interconnection to correspond to higher-speed operation of semiconductor devices, low dielectric constant materials having lower dielectric constants than conventional silicon compounds such as silicon oxide films and silicon nitride films have become increasingly used for interlayer insulating films. Lower dielectric constant materials having dielectric constants lower than 3 are significantly differ from conventional oxide film dielectrics in physical characteristics, such as lower Young's modulus, lower hardness, a higher coefficient of thermal expansion and higher moisture absorbency. The difference in the physical characteristics increases with a decrease in the dielectric constant. Thus, in a semiconductor device using a low dielectric constant material, large pressure is applied to an electrode pad in a testing process using a probe etc., and in a process for forming external electrical connection such as wire bonding. This causes a crack in an insulating film underlying the electrode pad and made of a low dielectric constant material. The insulating film absorbs moisture from the crack and diffuses the moisture, thereby degrading reliability of interconnects around the electrode pad.

In particular, in a charge coupled device (CCD) or an image sensor on which a circuit requiring high-speed operation, a chip including an interconnect layer needs to be located low in relation to optical characteristics. In this structure, the above-described problem easily occurs, since the thickness of the insulating film formed in the chip is reduced.

As conventional solution of the problem, there is a method of forming a multilayer of interconnects and vias under an electrode pad to mechanically reinforce the electrode pad structure, thereby reducing cracks. Also, there is a method of surrounding an electrode pad with a ring structure formed by stacking interconnects and line vias, thereby confining moisture inside the ring structure not to diffuse the moisture to the outside of the ring structure, even when a crack occurs in a layer under the electrode pad and the layer absorbs the moisture from the crack (see, e.g., Japanese Patent Publication No. 2005-142553).

FIGS. 21-23 illustrate a conventional semiconductor device having the electrode pad structure surrounded by the ring structure shown in the patent publication. As shown in FIGS. 21-23, an electrode pad structure 100 is formed on a semiconductor substrate 101 made of silicon. The electrode pad structure 100 includes a connecting portion 115 formed of a metal plate and formed on a plurality of insulating films stacked one on another. The stacked insulating films are sequentially formed on a semiconductor substrate 101, and are a first insulating film 102, a second insulating film 104, a third insulating film 107, and a fourth insulating film 111 including liner films 103 therebetween.

In a region below the connecting portion 115, a plurality of first interconnects 120 are formed in the second insulating film 104, a plurality of second interconnects 122 are formed in the third insulating film 107, a third interconnect 124 being a plate is formed in the fourth insulating film 111 to be in contact with the connecting portion 115. A plurality of vias 121 are formed between the first interconnects 120 and the second interconnects 122 to be connected to the first and second interconnects 120 and 122. A plurality of vias 123 are formed between the second interconnects 122 and the third interconnect 124 to be connected to the second and third interconnects 122 and 124. As such, a multilayer 117 including the connecting portion 115 of the electrode pad structure 100 is configured.

The multilayer 117 including the connecting portion 115 is surrounded by a ring body 118. The ring body 118 includes a fourth interconnect 130 formed in the second insulating film 104, a fifth interconnect 132 formed in the third insulating film 107, and a sixth interconnect 134 formed in the fourth insulating film 111. A line via 131 is formed between the fourth interconnect 130 and the fifth interconnect 132 to be connected to the fourth and fifth interconnects 130 and 132. A line via 133 is formed between the fifth interconnect 132 and the sixth interconnect 134 to be linearly connected to the fifth and sixth interconnects 132 and 134.

A first protective insulating film 114 is formed over the ring body 118 and on the fourth insulating film 111. A peripheral portion of the connecting portion 115 is formed on and across a peripheral portion of the first protective insulating film 114. In addition, a second protective insulating film 116 is formed on the first protective insulating film 114 to interpose the peripheral portion of the connecting portion 115 therebetween.

As shown in FIGS. 21 and 23, a lead line 124A electrically connected to an internal circuit is lead out from the electrode pad structure 100. The lead line 124A is a lead-out part of the third interconnect 124 under the connecting portion 115. Thus, a missing part 134a of the sixth interconnect 134 is formed in the part of the ring body 118, in which the lead line 124A is formed.

SUMMARY

As described above, the electrode pad in the conventional semiconductor device has the missing part in the part of the ring body, in which the lead line is formed. Thus, moisture is diffused outside the ring body from the missing part to cause degradation in reliability such as leakage in interconnects around the electrode pad.

Moreover, the thicknesses of insulating films are further reduced, and the hardness of the insulating films is further reduced by using low dielectric constant materials for the insulating films. This may cause removal of the insulating films under the electrode pad, and a large crack, which may lead to the removal of the insulating film, when external pressured is applied to the electrode pad. As a result, there is also the problem that the removal of the insulating films or spread of the crack by pressure of sealing (encapsulation) etc. in a manufacturing process breaks the ring body.

It is an objective of the present invention to solve the problems, i.e., to reduce diffusion of moisture from an electrode pad, and to correspond to reduction in the thicknesses and the dielectric constant of insulating films.

In order to achieve the objective, the present disclosure provides a semiconductor device having a lead line lead out from a multilayer structure including interconnects and vias forming an electrode pad, without providing a missing part in a ring body surrounding the electrode pad.

Specifically, a semiconductor device according to the present disclosure includes an electrode pad formed above a semiconductor substrate, and being a connecting portion for an external electrical connection; a plurality of insulating films stacked between the semiconductor substrate and the connecting portion; a protective film formed on the plurality of insulating films, and having an opening; a multilayer body including a plurality of first interconnect layers formed in the plurality of insulating films and including an upper interconnect connected to the electrode pad in the opening of the protective film, and a via configured to connect the first interconnect layers; a ring body formed in the plurality of insulating films to surround the multilayer body without interposing space, and including a plurality of second interconnect layers and at least one line via linearly connecting the second interconnect layers; and a lead line electrically connecting the connecting portion to an internal circuit. The upper interconnect has a larger width than the opening of the protective film. The multilayer body is connected to the ring body by at least one of the plurality of first interconnect layers. The lead line is connected to the ring body.

In the semiconductor device according to the present disclosure, the lead line is connected to the ring body. Thus, even when a crack occurs in the insulating films to allow moisture to enter the insulating films when external pressure of a probe etc. is applied to the electrode pad, the moisture can be retained inside the ring body, since the ring body surrounds the multilayer body without space. This reduces degradation of reliability of interconnects around the electrode pad caused by the moisture. Also, since the multilayer body is connected to the ring body by at least one of the first interconnect layers, the external stress can by supported not only by the multilayer body under the electrode pad but also by the ring body. This improves the mechanical strength of the electrode pad itself, thereby reducing cracks, and removal of the insulating films.

In the semiconductor device according to the present disclosure, the lead line may be a power supply line, and may be connected to an upper interconnect of the plurality of second interconnect layers.

With this structure, unlike the case where the power supply line is connected to a lower interconnect of the ring body, there is no need to connect the power supply line from the lower interconnect to the upper interconnect via the via. As a result, the resistance at the power supply line can be reduced, thereby increasing the power supply capabilities.

In the semiconductor device according to the present disclosure, the plurality of first interconnect layers may include an interconnect arranged in a form extending in a direction toward the internal circuit.

As such, since one of the plurality of first interconnect layers is formed in the direction toward the internal circuit which is the operating direction of a probe applying pressure to the electrode pad, the mechanical strength of the electrode pad can be increased with respect to the pressure of the probe. When the lead line is lead out from the inside of the ring body, the resistance at the lead line can be reduced as compared to the case where the multilayer body is connected to the ring body by an interconnect in a direction parallel to an outer peripheral surface of the semiconductor substrate.

In this case, the one of the plurality of first interconnect layers connected to the ring body may be an interconnect being the third layer under the connecting portion.

This structure enables stable connection as compared to the case where one of the plurality of first interconnect layers directly under the connecting portion formed of an interconnect having a relatively large area and easily causing dishing in polishing is connected to the ring body. Furthermore, since the pressure of the probe is larger in an upper insulating film than in a lower insulating film, the mechanical strength of the electrode pad can be increased with respect to the pressure of the probe when the interconnect being the third layer under the connection portion is connected to the ring body.

In the semiconductor device according to the present disclosure, the plurality of first interconnect layers may include an interconnect arranged in a form extending in a direction parallel to an end surface of the semiconductor substrate closest to the electrode pad (i.e., in a direction parallel to the closest outer peripheral surface).

With this structure, the mechanical strength of the electrode pad can be increased with respect to the pressure applied in wire bonding etc. in the direction parallel to the outer peripheral surface of the electrode pad.

In the semiconductor device according to the present disclosure, the plurality of first interconnect layers may include a first interconnect arranged in a form extending in a direction toward the internal circuit, and a second interconnect arranged in a form extending in a direction parallel to an end surface of the semiconductor substrate closest to the electrode pad. The second interconnect may be provided lower than the first interconnect.

As such, by using as an upper layer, the first interconnect which reinforces the structure of the electrode pad with respect to the probe and arranged in the form extending in the direction toward the internal circuit, the mechanical strength of the electrode pad can be increased as compared to the case where the first interconnect is provided lower.

In the semiconductor device according to the present disclosure, an upper interconnect of the plurality of second interconnect layers may have a larger width than a lower interconnect of the plurality of second interconnect layers.

As such, in the plurality of second interconnect layers of the ring body, the width of the interconnect formed in an upper insulating film, in which a crack is most easily caused by the external pressure applied to the electrode pad and which easily absorbs moisture, is set larger, thereby further reducing the diffusion of the moisture from the ring body.

In the semiconductor device according to the present disclosure, an outer peripheral surface of an upper interconnect of the plurality of second interconnect layers may be located outside an outer peripheral surface of a lower interconnect.

With this structure, the lower interconnect, which is finer than the upper interconnect in most cases, can be effectively used as a material of the electrode pad.

In the semiconductor device according to the present disclosure, the at least one line via may include an upper line via and a lower line via. The upper line via may have a larger width than the lower line via.

As such, in the plurality of second interconnect layers of the ring body, the width of the line via formed in an upper insulating film, in which a crack most easily occurs and which easily absorbs moisture, is set larger; thereby further reducing the diffusion of the moisture from the ring body.

In the semiconductor device according to the present disclosure, the at least one line via may include an upper line via and a plurality of lower line vias. The plurality of lower line vias may be formed along each other.

As such, since fine interconnects are needed in the internal circuit, the plurality of lower line vias of the ring body are used, which cannot have larger widths than the upper line vias. This increases the advantage of reducing the diffusion of the moisture and reinforcing the electrode pad.

In the semiconductor device according to the present disclosure, a plurality of lower interconnects of the plurality of second interconnect layers may be formed along each other.

With this structure, since fine interconnects are needed in the internal circuit, the plurality of lower interconnects of the ring body are used, which cannot have larger widths than the upper interconnects. This increases the advantage of reducing the diffusion of the moisture and reinforcing the electrode pad.

In the semiconductor device according to the present disclosure, the plurality of insulating films may have different dielectric constants. An upper insulating film may have a higher dielectric constant than a lower insulating film.

As such, the upper insulating film, in which a crack is most easily caused by the external pressure applied to the electrode pad and which easily absorbs moisture, is an insulating film having higher Young's modulus and hardness, and absorbing less moisture than the material having a lower dielectric constant. This increases the advantage of reducing the diffusion of the moisture and reinforcing the electrode pad.

As described above, the semiconductor device according to the present disclosure reduces the diffusion of the moisture from the electrode pad and corresponds to reduction in the thickness and dielectric the constant of the insulating films.

DETAILED DESCRIPTION

First Example Embodiment

A semiconductor device according to a first example embodiment will be described hereinafter with reference to the drawings.

Figure 1:
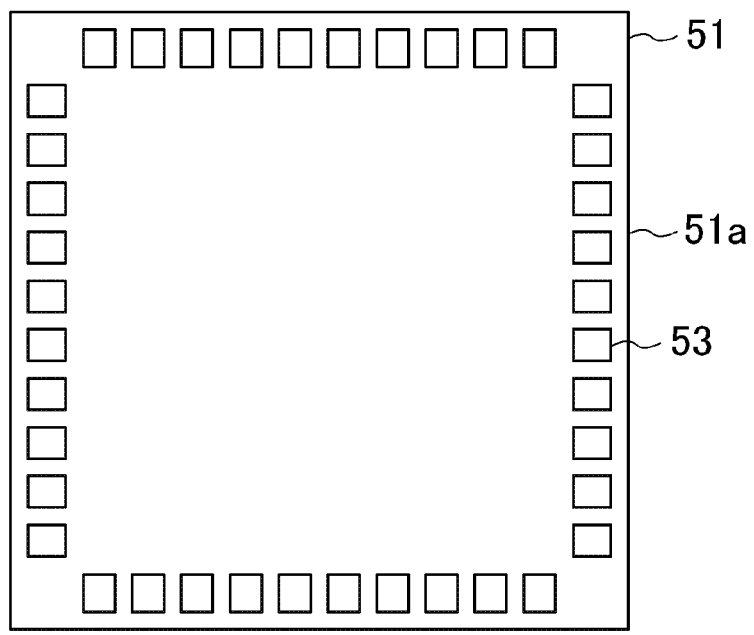
FIG. 1 is a top view of a semiconductor device according to a first example embodiment.

As shown in FIG. 1, the semiconductor device according to the first example embodiment includes an internal circuit inside a semiconductor chip 51, and a plurality of electrode pad structures 53 in the semiconductor chip 51 to surround the internal circuit (in a peripheral portion of the semiconductor chip 51) in a so-called peripheral arrangement. Although it is not shown, a seal ring including interconnects and line vias is formed inside a chip end surface 51a of the semiconductor chip 51 to surround the internal circuit and the plurality of electrode pad structures 53. Note that the arrangement of the electrode pad structures 53 is not limited to the above-described arrangement. When viewed from the electrode pad structures 53, the internal circuit is located outside the electrode pad structures 53. The internal circuit denotes, for example, an interconnect structure including semiconductor elements such as transistors, insulating films, and interconnects.

Figure 2:
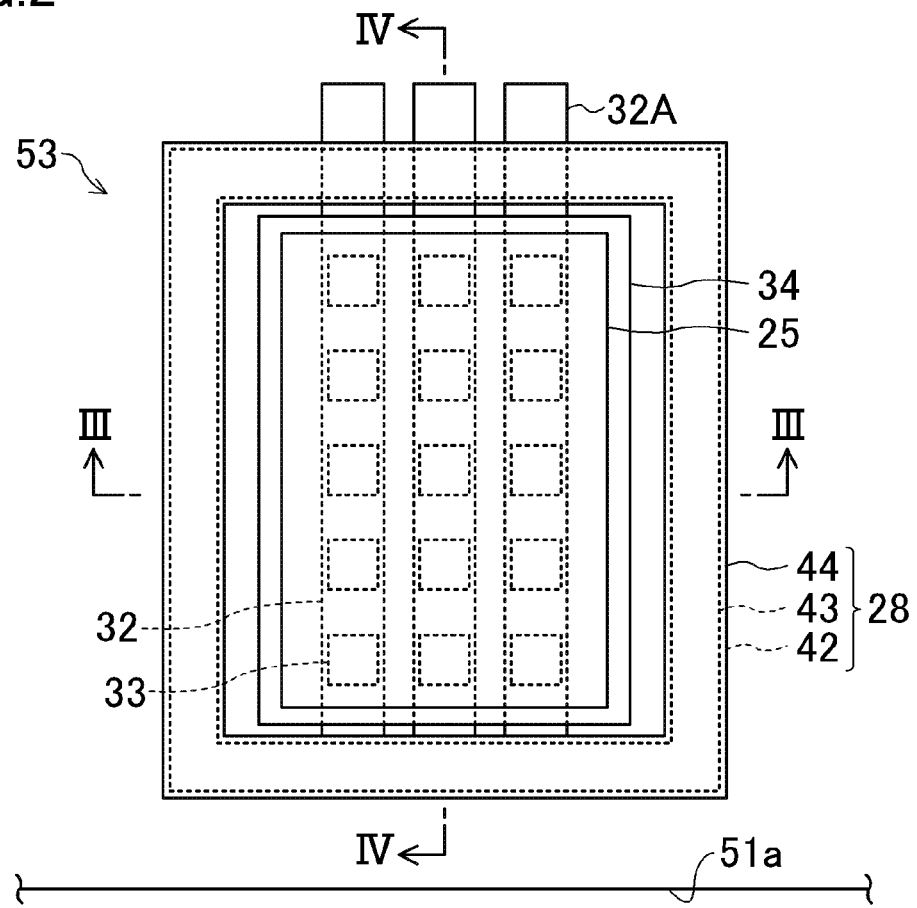
FIG. 2 is a top view illustrating an electrode pad structure in the semiconductor device according to the first example embodiment.
Figure 3:
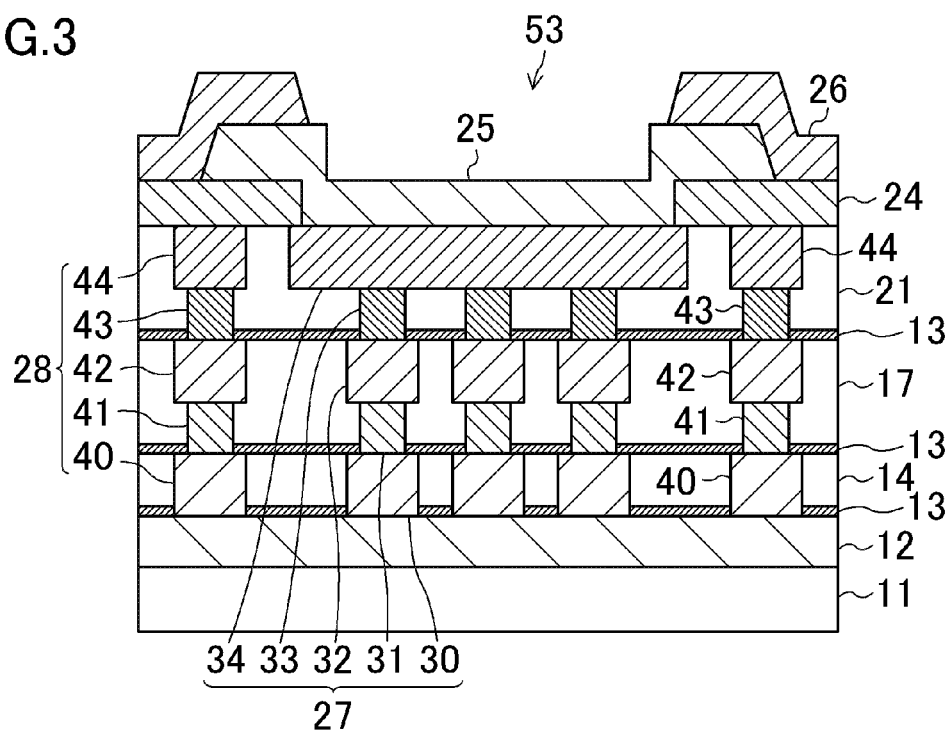
FIG. 3 is a cross-sectional view taken along the line III-III of FIG. 2.
Figure 4:
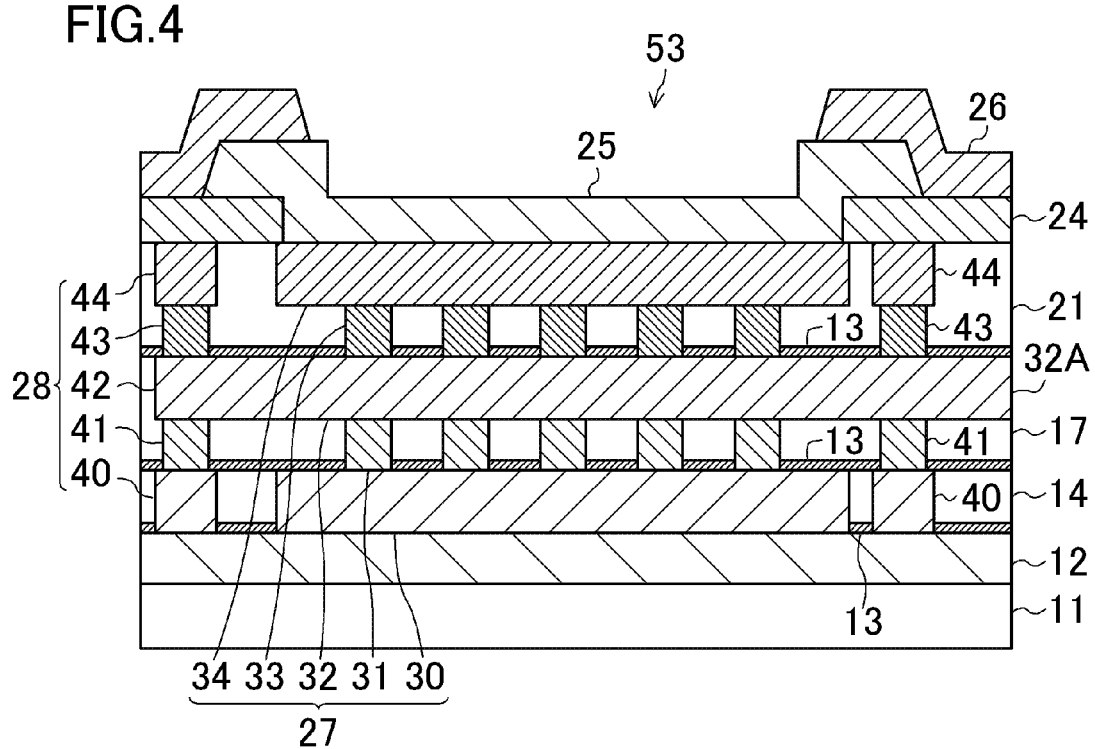
FIG. 4 is a cross-sectional view taken along the line IV-IV of FIG. 2.

FIGS. 2-4 illustrate the structure of each of the electrode pad structures 53. As shown in FIGS. 2-4, the electrode pad structure 53 includes interconnects and vias formed on a plurality of insulating films on a semiconductor substrate 11 made of, e.g., silicon (Si), and a connecting portion (electrode pad) 25 formed on the uppermost interconnect and being a metal plate. The stacked insulating films are sequentially formed from the side of the substrate, and are a first insulating film 12, a second insulating film 14, a third insulating film 17, and a fourth insulating film 21 including the liner films 13 interposed therebetween.

In a region below the connecting portion 25, a plurality of first interconnects 30 are formed in the second insulating film 14, a plurality of second interconnects 32 are formed in the upper portion of the third insulating film 17, a third interconnect 34 being a plate is formed in the upper part of the fourth insulating film 21 to be in contact with the connecting portion 25. A plurality of vias 31 are formed between the first interconnects 30 and the second interconnects 32 to be in contact with the first and second interconnects 30 and 32. A plurality of vias 33 are formed between the second interconnects 32 and the third interconnect 34 to be in contact with the second and third interconnects 32 and 34. As such, a multilayer 27 including the connecting portion 25 of the electrode pad structure 53 is configured.

The multilayer 27 including the connecting portion 25 is surrounded by a ring body 28. The ring body 28 includes a fourth interconnect 40 formed in the second insulating film 14, a fifth interconnect 42 formed in the upper portion of the third insulating film 17, and a sixth interconnect 44 formed in the upper part of the fourth insulating film 21. A line via 41 is formed between the fourth interconnect 40 and the fifth interconnect 42 to be connected to the fourth and fifth interconnects 40 and 42. A line via 43 is formed between the fifth interconnect 42 and the sixth interconnect 44 to be linearly connected to the fifth and sixth interconnects 42 and 44.

A first protective insulating film 24 is formed over the ring body 28 and on the fourth insulating film 21. A peripheral portion of the connecting portion 25 is formed on and across a peripheral portion of the first protective insulating film 24. In addition, a second protective insulating film 26 is formed on the first protective insulating film 24 to interpose the peripheral portion of the connecting portion 25 therebetween.

As shown in FIG. 4, the electrode pad structure 53 in the semiconductor device according to this embodiment is provided with lead lines 32A, which are connected to an internal circuit (not shown), by extending the second interconnects 32 forming the multilayer 27. Furthermore, the second interconnects 32 are formed integrally with and connected to the fifth interconnect 42 forming the ring body 28.

Thus, in the first example embodiment, the lead lines 32A are formed by externally leading out the second interconnects 32 of the multilayer 27 while penetrating the ring body 28, and thus, no missing part is formed in the ring body 28.

A method of manufacturing the semiconductor device according to this embodiment, i.e., the electrode pad structure 53, will be described below. An example will be described where low dielectric constant materials are used for the insulating films, and copper (Cu) is used for the interconnects and vias.

First, the first insulating film 12 containing silicon dioxide (SiO$_2$) as a main component is formed by chemical vapor deposition (CVD), on the semiconductor substrate 11 being a wafer provided with a preferable semiconductor element to cover the semiconductor element. Then, one of the liner films 13 being a nitride insulating film such as silicon nitride (SiN), silicon carbonitride (SiCN), or silicon oxynitride (SiON), and the second insulating film 14 made of a low dielectric constant material such as carbon-containing silicon oxide (SiOC) are formed on the first insulating film 12.

Next, interconnect trenches for the first interconnects forming the multilayer 27, and interconnect trenches for the fourth interconnect forming the ring body 28 are formed in predetermined regions of the second insulating film 14 and the liner films 13 by lithography and etching.

Then, a tantalum nitride (TaN) film and a copper (Cu) seed film are formed on the entire surface of the second insulating film 14 including the plurality of interconnect trenches by sputtering, for example.

After that, a Cu film is deposited on the Cu seed film by electroplating, for example.

Next, the deposited Cu film is planarized by, for example, chemical mechanical planarization (CMP) until the second insulating film 14 is exposed so as to form the first interconnects 30 and the fourth interconnect 40 made of copper.

Next, another one of the liner films 13 being a nitride insulating film and the third insulating film 17 made of a low dielectric constant material are formed by CVD on the entire surface of the second insulating film 14 including the first interconnects 30 and the fourth interconnect 40. Then, the vias 31 and the line via 41, the overlying second interconnects 32 and the fifth interconnect 42, and the lead lines 32A are formed at the same time in the formed third insulating film 17. In this embodiment, dual damascene is used, in which interconnects and underlying vias are formed at the same time.

However, not limited to the dual damascene, single damascene may be used, in which the vias 31 etc. and the second interconnects 32 etc. on the vias 31 etc. are formed in separate insulating films.

Then, similarly, after forming the fourth insulating film 21, the vias 33 and the line via 43, and the overlying third interconnect 34 and the sixth interconnect 44 are formed.

Next, the first protective insulating film 24 made by SiN etc. is formed on the entire surface of the fourth insulating film 21 including the third interconnect 34 and the sixth interconnect 44 by CVD, for example. Then, an opening exposing the third interconnect 34 is formed in the first protective insulating film 24 by lithography and etching.

Then, a barrier metal film (not shown) made of titanium (Ti) and titanium nitride (TiN), and, for example, an aluminum (Al) film are deposited on the first protective insulating film 24 by sputtering, for example, to over the opening exposing the third interconnect 34. After that, the deposited barrier metal film and the aluminum film are patterned in a region including the opening to form the connecting portion 25.

Next, the second protective insulating film 26 made of SiN etc. is formed by CVD, for example, on the entire surface of the first protective insulating film 24 including the connecting portion 25. Then, the connecting portion 25 is exposed from the second protective insulating film 26 by lithography and etching to form the electrode pad structure 53.

Note that the method of manufacturing according to the first example embodiment is merely an example, and the present disclosure does not relate to a manufacturing method. That is, the present disclosure is not limited to the above-described materials and the manufacturing method.

As described above, in the semiconductor device according to the first example embodiment, the lead lines 32A connecting the electrode pad structure 53 to the internal circuit, is mechanically and electrically connected to the multilayer 27 including the connecting portion 25 via the ring body 28. Thus, the ring body 28 completely surrounds the multilayer 27 without any cut. Thus, even if a crack occurs in the fourth insulating film 21, the third insulating film 17, and the second insulating film 14 under the connecting portion 25 so that moisture enters the insulating films by applying external stress to the connecting portion 25 of the electrode pad structure 53 with a probe etc.; the entering moisture can be retained inside the ring body 28. This reduces degradation of reliability of other interconnects provided around the electrode pad structure 53.

The second interconnects 32, which are formed in the third insulating film 17 and include the lead lines 32A, are formed to extend in an inner direction of the semiconductor chip 51 (in a direction perpendicular to the closest chip end surface 51a), which is the operating direction of the probe applying pressure to the electrode pad structure 53. Furthermore, the second interconnects 32 connecting the multilayer 27 and the ring body 28 together, thereby reinforcing the electrode pad structure 53 itself. Thus, the pressure in the inner direction of the semiconductor chip 51, which includes the pressure of the probe causing the highest pressure in the electrode pad structure 53, is easily transmitted to the ring body 28 via the multilayer 27 including the connecting portion 25. Therefore, mechanical strength of the electrode pad structure 53 with respect to the pressure in the inner direction of the semiconductor chip 51 can be increased.

In addition, the lead lines 32A, which are lead out from the electrode pad structure 53 to the internal circuit, are lead out from the inner portion of the semiconductor chip 51 in the ring body 28. As such, the second interconnects 32 under the connecting portion 25 are lead out, the resistance at the lead lines 32A can be reduced as compared to the case where interconnects in a direction parallel to the closest chip end surface 51a are lead out. Furthermore, mechanically and electrically stable connection can be provided as compared to the case where the uppermost third interconnect 34, which has a relatively large area and easily causes dishing in polishing such as CMP, is a lead line.

When the probe is in contact with the connecting portion 25, the higher the insulating film is located, the larger the pressure of the probe has. Thus, the electrode pad structure 53 can be reinforced with respect to the pressure of the probe as compared to the case where the interconnect under two layers under the connecting portion 25 of the electrode pad structure 53, i.e., the first interconnects 30 are lead out.

First Variation of First Example Embodiment

Figure 5:
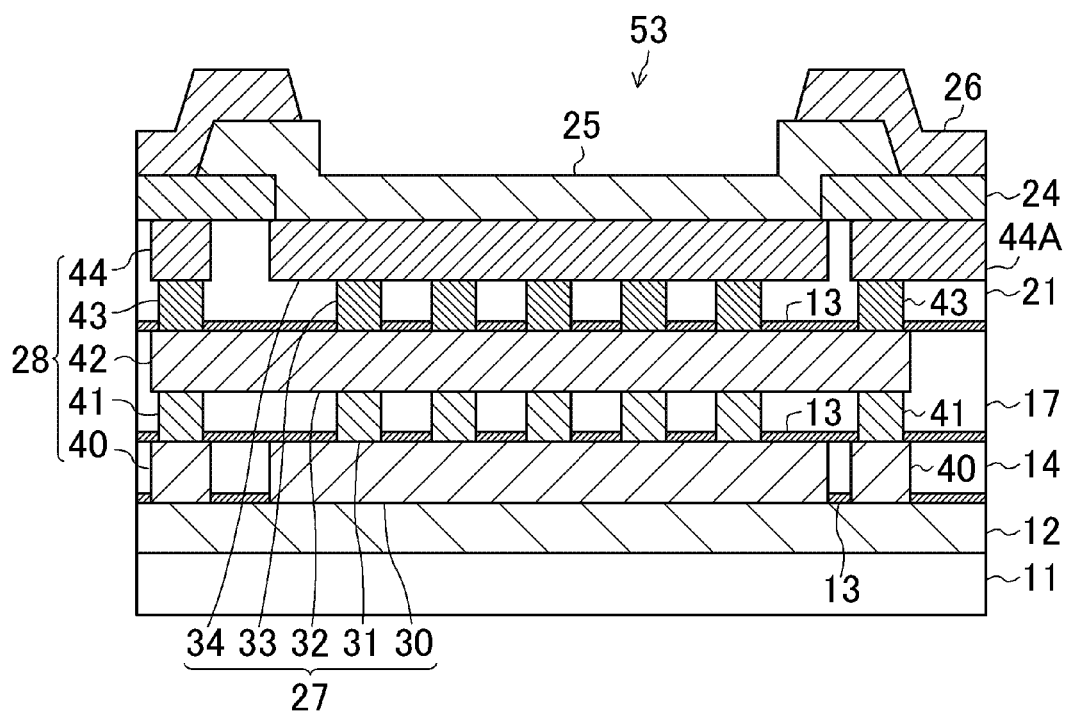
FIG. 5 is a cross-sectional view of an electrode pad structure in a semiconductor device according to a first variation of the first example embodiment.

FIG. 5 illustrates a cross-sectional structure of a semiconductor device according to a first variation of the first example embodiment. As shown in FIG. 5, in the electrode pad structure 53 of the semiconductor device according to this variation, a lead line 44A, which is lead out from the multilayer 27 connected to the ring body 28 to the internal circuit, is used as a power supply line formed by the sixth interconnect 44 in the uppermost fourth insulating film 21.

That is, the lead line 44A for the power supply line is formed by the uppermost sixth interconnect 44 of the ring body 28. Thus, unlike the case where the lead line 44A is formed by the fifth interconnect 42 or the fourth interconnect 40 located lower in the ring body 28, there is no need to connect the power supply line from the underlying interconnects 42 and 40 to the uppermost sixth interconnect 44 via the vias 41 and 43. As a result, the resistance at the power supply line can be reduced, thereby reinforcing the power supply capabilities.

Second Variation of First Example Embodiment

Figure 6:
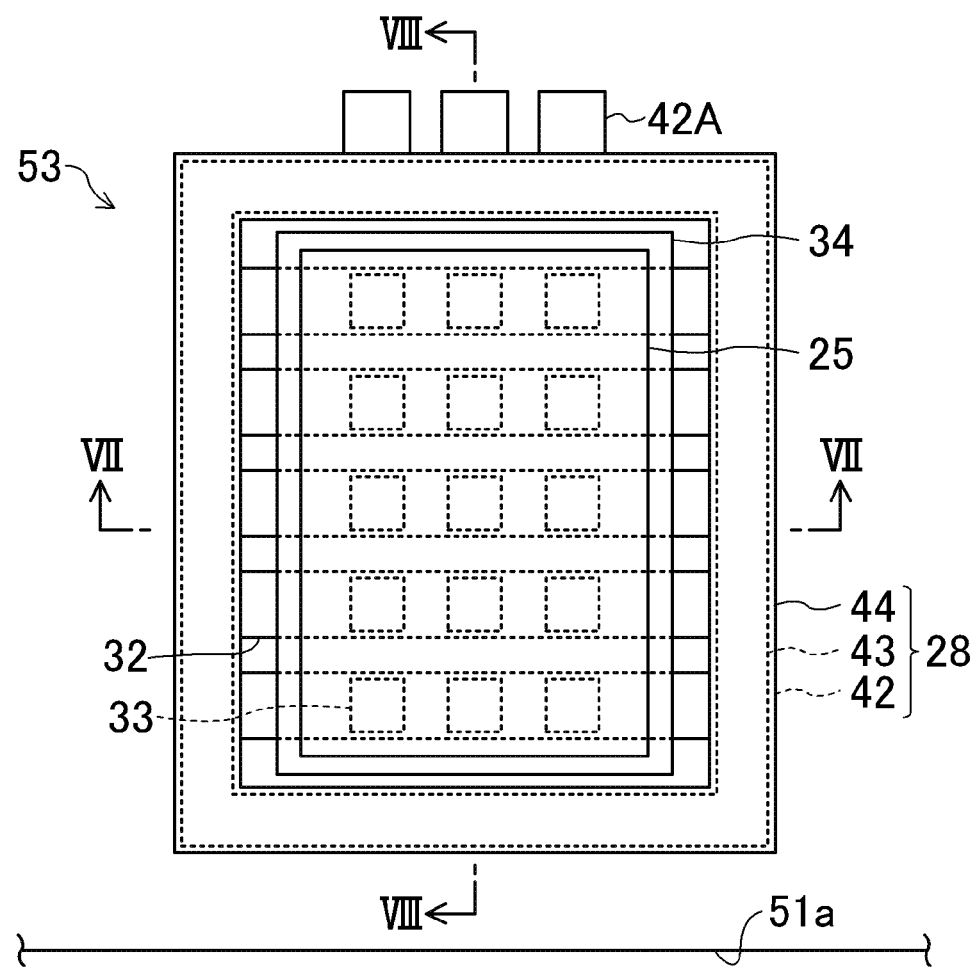
FIG. 6 is a top view of an electrode pad structure in a semiconductor device according to a second variation of the first example embodiment.
Figure 7:
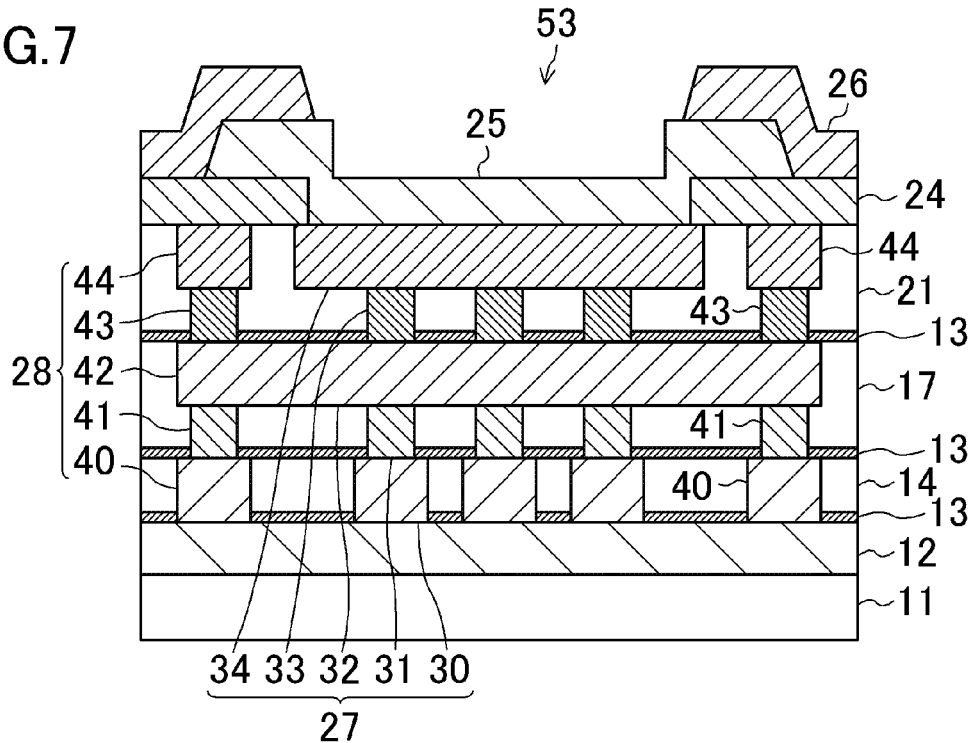
FIG. 7 is a cross-sectional view taken along the line VII-VII of FIG. 6.
Figure 8:
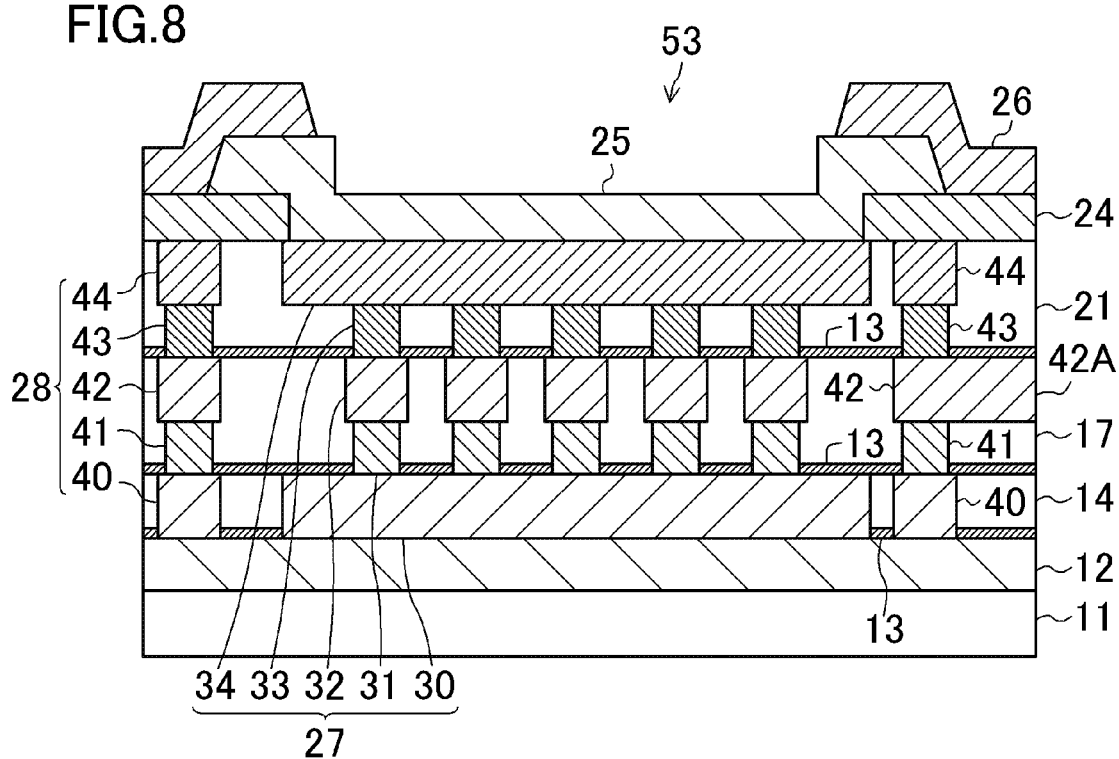
FIG. 8 is a cross-sectional view taken along the line VIII-VIII of FIG. 6.

FIGS. 6-8 illustrate an electrode pad structure in a semiconductor device according to a second variation of the first example embodiment.

As shown in FIGS. 6-8, in the second variation, the second interconnects 32 forming the multilayer 27 including the connecting portion 25 are arranged in a direction parallel to the closest chip end surface 51a. Furthermore, the second interconnects 32 are formed integrally with and connected to the fifth interconnect 42 forming the ring body 28.

Furthermore, a lead line 42A connected to the internal circuit is formed integrally with and connected to the fifth interconnect 42.

In general, in bonding such as wire bonding, stress applied to the connecting portion 25 of the electrode pad structure 53 is easily transmitted in the direction parallel to the chip end surface 51a of the semiconductor chip 51. Thus, when the electrode pad structure 53 according to the second variation is used, the mechanical strength of the electrode pad structure 53 can be increased with respect to the pressure in the direction parallel to the closest chip end surface 51a of the semiconductor chip 51.

Third Variation of First Example Embodiment

Figure 9:
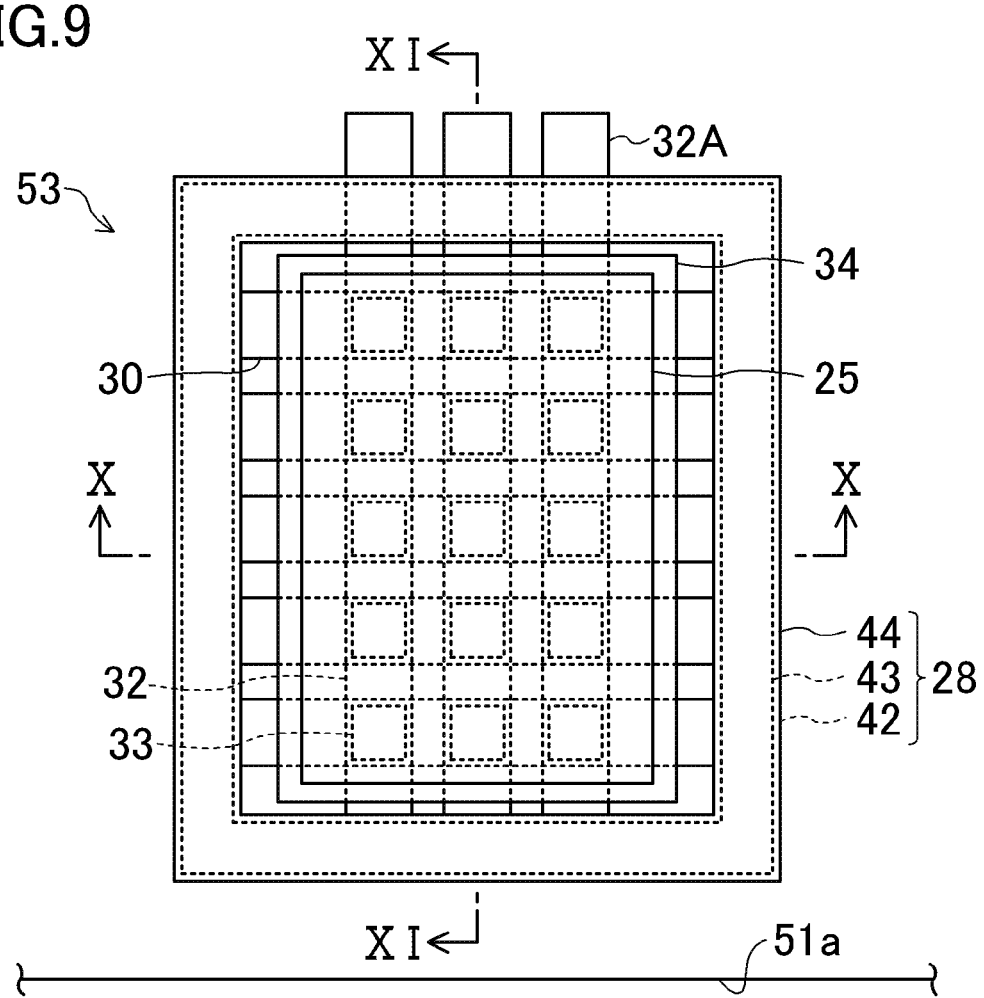
FIG. 9 is a top view of an electrode pad structure in a semiconductor device according to a third variation of the first example embodiment.
Figure 10:
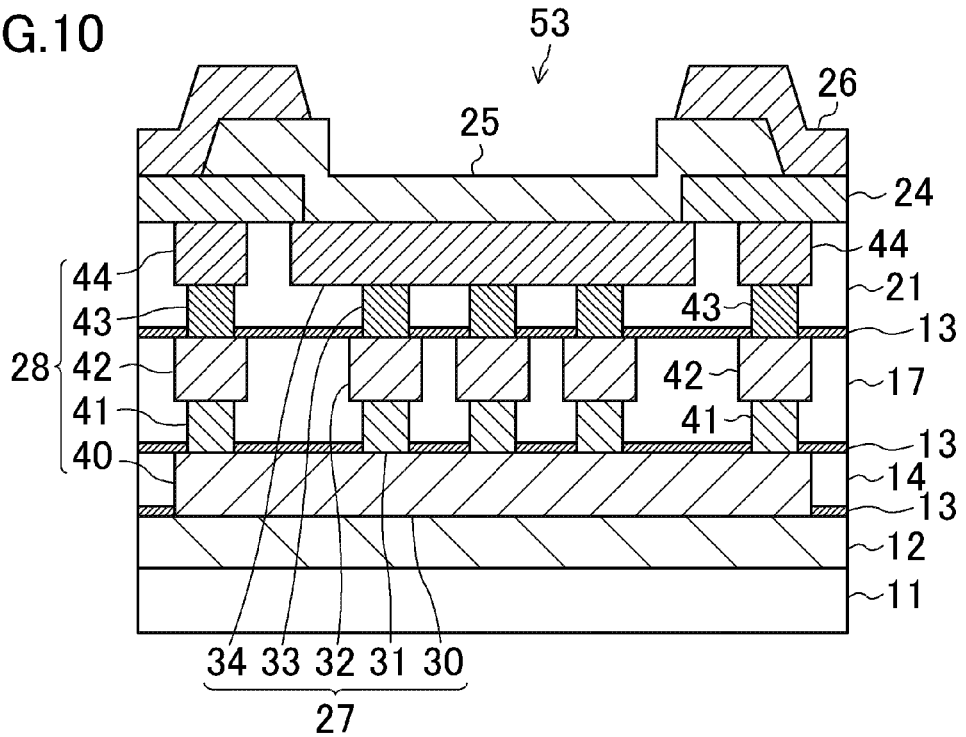
FIG. 10 is a cross-sectional view taken along the line X-X of FIG. 9.
Figure 11:
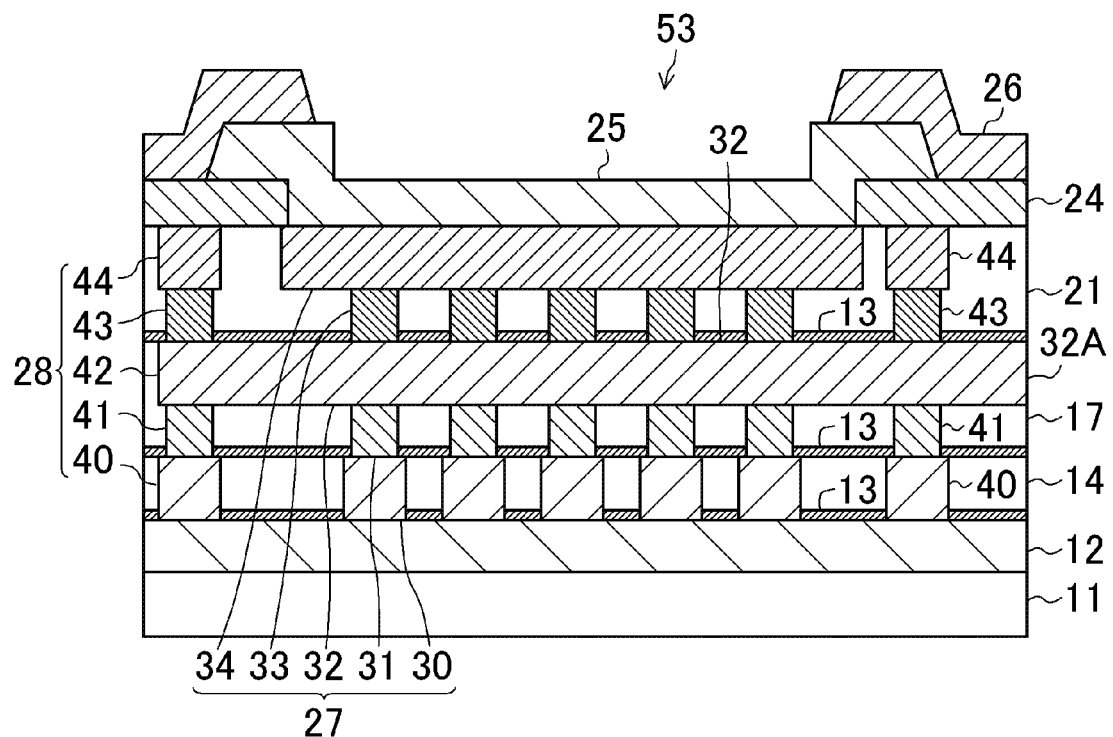
FIG. 11 is a cross-sectional view taken along the line XI-XI of FIG. 9.

FIGS. 9-11 illustrate an electrode pad structure in a semiconductor device according to a third variation of the first example embodiment.

As shown in FIGS. 9-11, in the third variation, similar to the first example embodiment, the second interconnects 32 forming the multilayer 27 including the connecting portion 25 and extending in an internal direction of the semiconductor chip 51 are formed integrally with and connected to the fourth interconnect 40 of the ring body 28.

In this variation, as shown in FIGS. 9 and 10, the first interconnects 30 forming the multilayer 27 are connected to the ring body 28 in the direction parallel to the closest chip end surface 51a.

With this structure, in this variation, since the first interconnects 30 forming the multilayer 27 are connected to the ring body 28, the mechanical strength of the electrode pad structure 53 can be further improved. In addition, the second interconnects 32 located higher in the multilayer 27 are arranged in the internal direction of the semiconductor chip 51. This improves the resistance to the stress with respect to the probe applying the largest pressure to the electrode pad structure 53, as compared to the case where the first interconnects 30 located lower are arranged in the internal direction of the semiconductor chip 51.

Fourth Variation of First Example Embodiment

Figure 12:
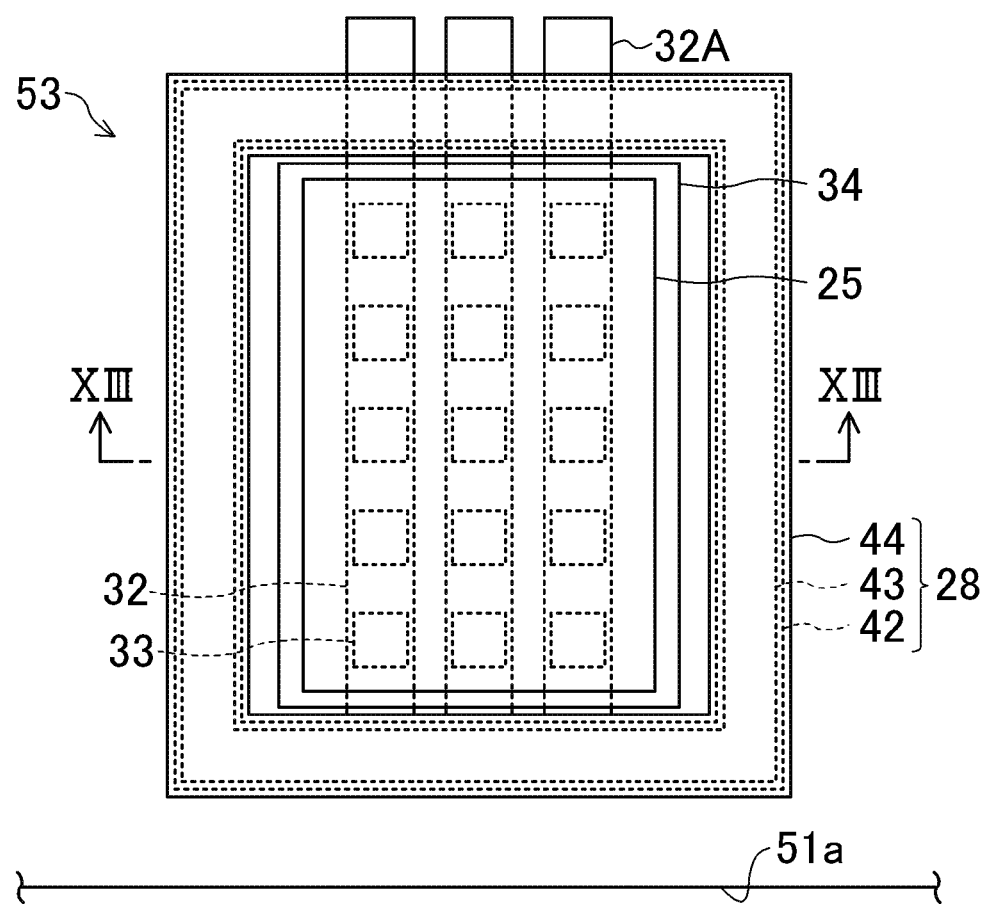
FIG. 12 is a top view of an electrode pad structure in a semiconductor device according to a fourth variation of the first example embodiment.
Figure 13:
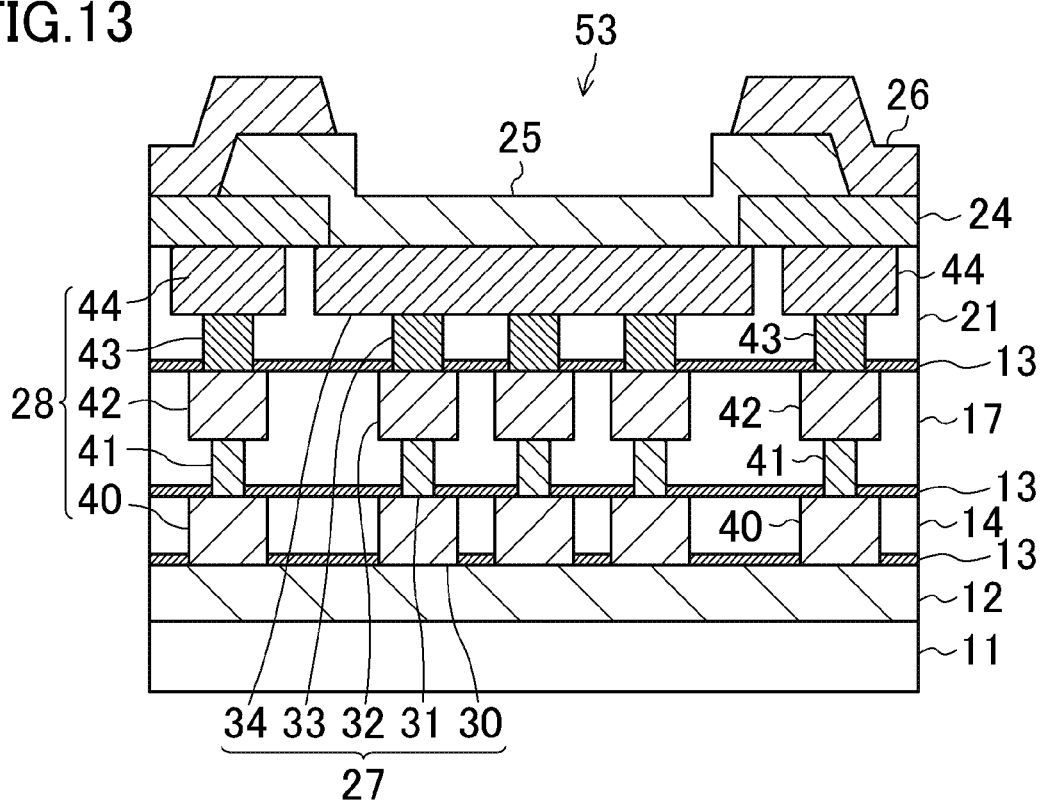
FIG. 13 is a cross-sectional view taken along the line XIII-XIII of FIG. 12.

FIGS. 12 and 13 illustrate an electrode pad structure in a semiconductor device according to a fourth variation of the first example embodiment.

As shown in FIGS. 12 and 13, the first difference between the fourth variation and the first example embodiment is that, in the fourth variation, the width of the sixth interconnect 44 located higher in the ring body 28 is set larger than those of the fifth interconnect 42 and the fourth interconnect 40 located lower. Furthermore, the outer side surface of the sixth interconnect 44 is located outside the outer surfaces of the fifth interconnect 42 and the fourth interconnect 40.

The second difference is that, in the fourth variation, the radiuses of the vias 33 located higher in the multilayer 27 are larger than those of the vias 31 located lower. Similarly, the width of the line via 43 located higher in the ring body 28 is larger than that of the line via 41.

As such, in the fourth variation, the widths of the sixth interconnect 44 and the line via 43 forming the ring body 28 and formed in the fourth insulating film 21 located higher, in which a crack is most easily caused by the external pressure applied to the electrode pad structure 53 and which easily absorbs moisture, are larger than those of the interconnects 42 and 40, and the line via 41 located lower. This improves the advantage of reducing the external diffusion of the moisture to the ring body 28.

The outer peripheral surface of the sixth interconnect 44 located higher in the ring body 28 is located outside the outer peripheral surface of the underlying interconnects 42 and 40. Thus, the first interconnects 30, the second interconnects 32, the fourth interconnect 40, and the fifth interconnect 42 located lower, which are in most cases finer than the third interconnect 34 and the sixth interconnect 44 located higher, are effectively used near the electrode pad structure 53.

Fifth Variation of First Example Embodiment

Figure 14:
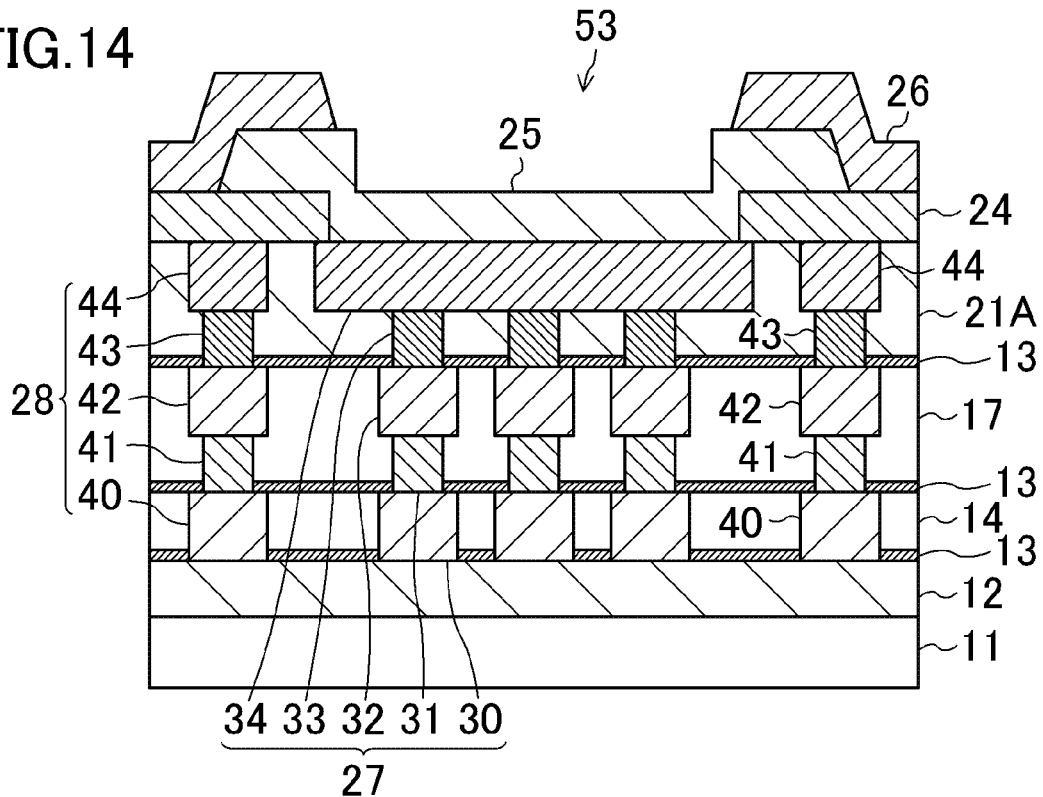
FIG. 14 is cross-sectional view of an electrode pad structure in a semiconductor device according to a fifth variation of the first example embodiment.

FIG. 14 illustrates an electrode pad structure in a semiconductor device according to a fifth variation of the first example embodiment.

As shown in FIG. 14, in the fifth variation, a fourth insulating film 21A located higher is made of silicon dioxide having a high dielectric constant in place of the low dielectric constant material.

As such, in this variation, the fourth insulating film 21A located higher, in which a crack is most easily caused by the external pressure applied to the electrode pad structure 53 and which easily absorbs moisture, is made of a material having higher Young's modulus and hardness, and absorbing less moisture than the material having a lower dielectric constant.

This increases the advantage of reducing the diffusion of the moisture and improving the mechanical strength in the electrode pad structure 53.

Second Example Embodiment

A semiconductor device according to a second example embodiment will be described hereinafter with reference to the drawings.

Figure 15:
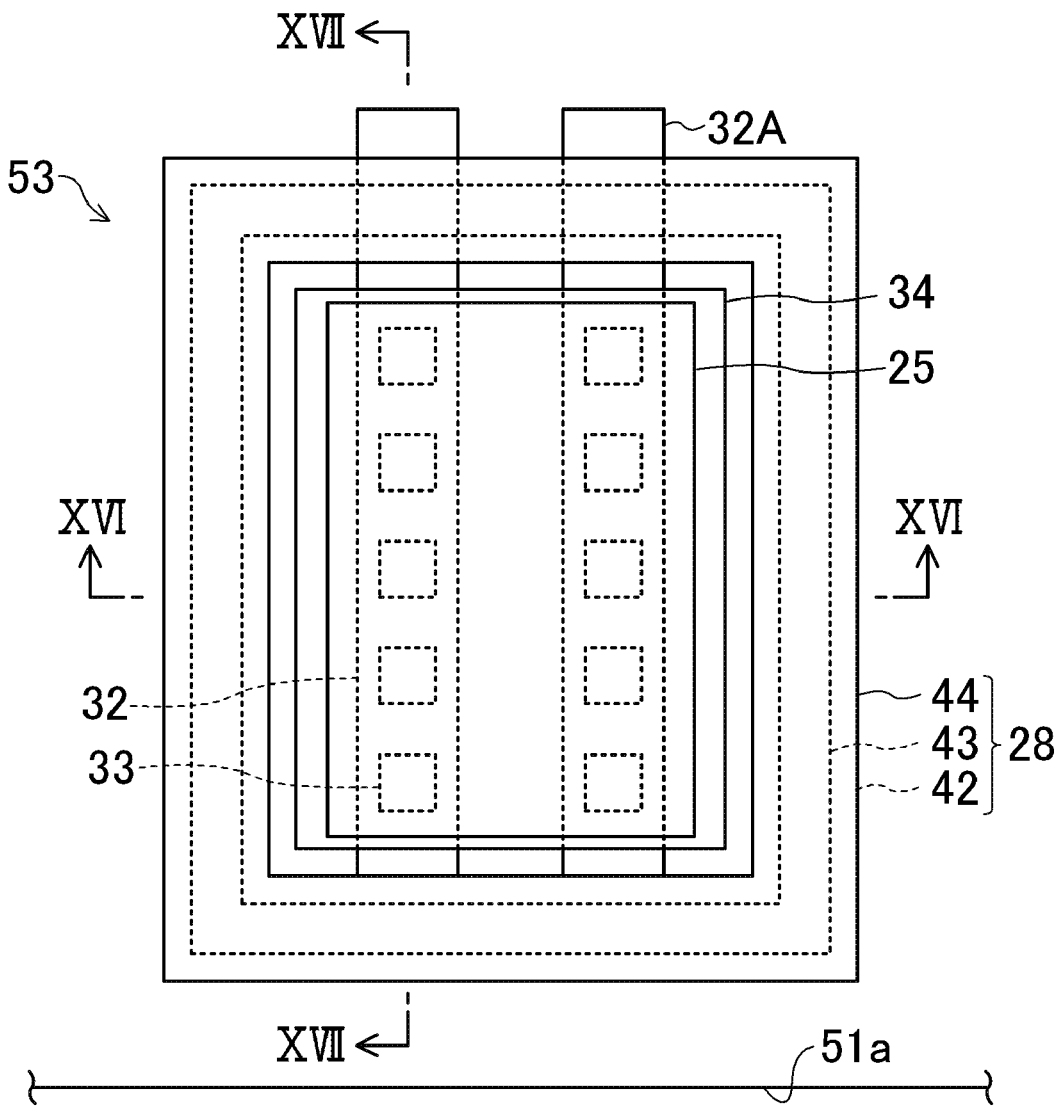
FIG. 15 is a top view illustrating an electrode pad structure in a semiconductor device according to a second example embodiment.
Figure 16:
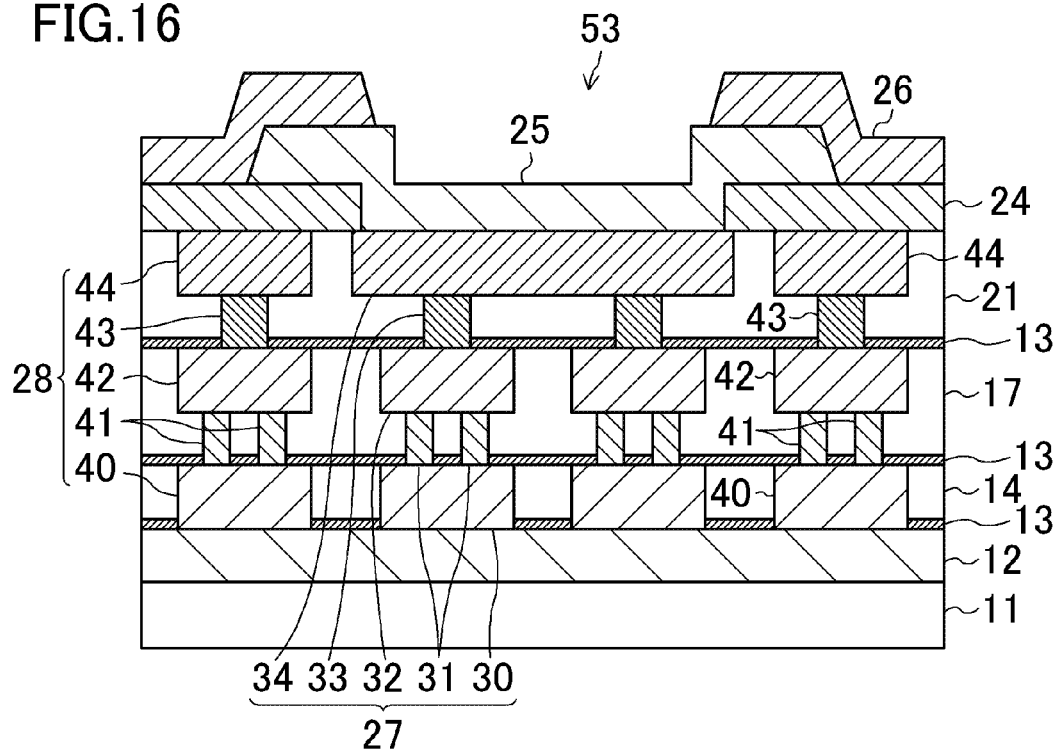
FIG. 16 is a cross-sectional view taken along the line XVI-XVI of FIG. 15.
Figure 17:
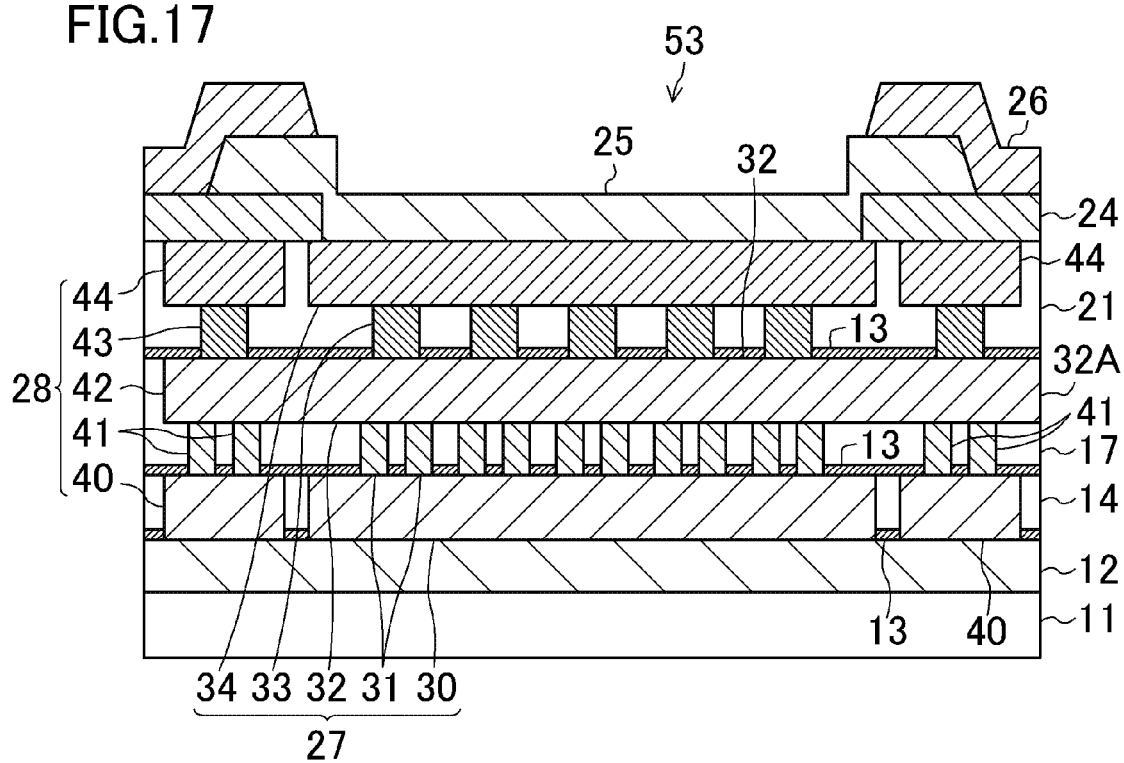
FIG. 17 is a cross-sectional view taken along the line XVII-XVII of FIG. 15.

FIGS. 15-17 illustrate a structure of the electrode pad structure 53. As shown in FIGS. 15-17, the same reference characters as those shown in FIGS. 2-4 are used to represent equivalent elements, and the explanation thereof will be omitted.

First, as shown in FIGS. 15-16, the electrode pad structure 53 in the semiconductor device according to the second example embodiment includes two first interconnects 30 and two second interconnects 32 forming the multilayer 27.

Furthermore, the second example embodiment differs from the first example embodiment in that, for example, four fine vias are used as the vias 31 located lower in the multilayer 27, and two fine vias extending parallel to each other are used as the line via 41 located lower in the ring body 28. That is, the number of the lower line vias is larger than that of the upper line vias.

In general, fine vias are needed in the internal circuit formed in the semiconductor chip 51. Thus, in the second example embodiment, the plurality of lower line vias 41 are used, which cannot have larger widths than the upper line via 43, the sixth interconnect 44, the fifth interconnect 42, and the fourth interconnect 40 in the ring body 28.

This structure reinforces the part of the ring body 28 having the smallest width, thereby increasing the advantage of reducing the diffusion of the moisture and of improving the mechanical strength in the electrode pad structure 53.

First Variation of Second Example Embodiment

Figure 18:
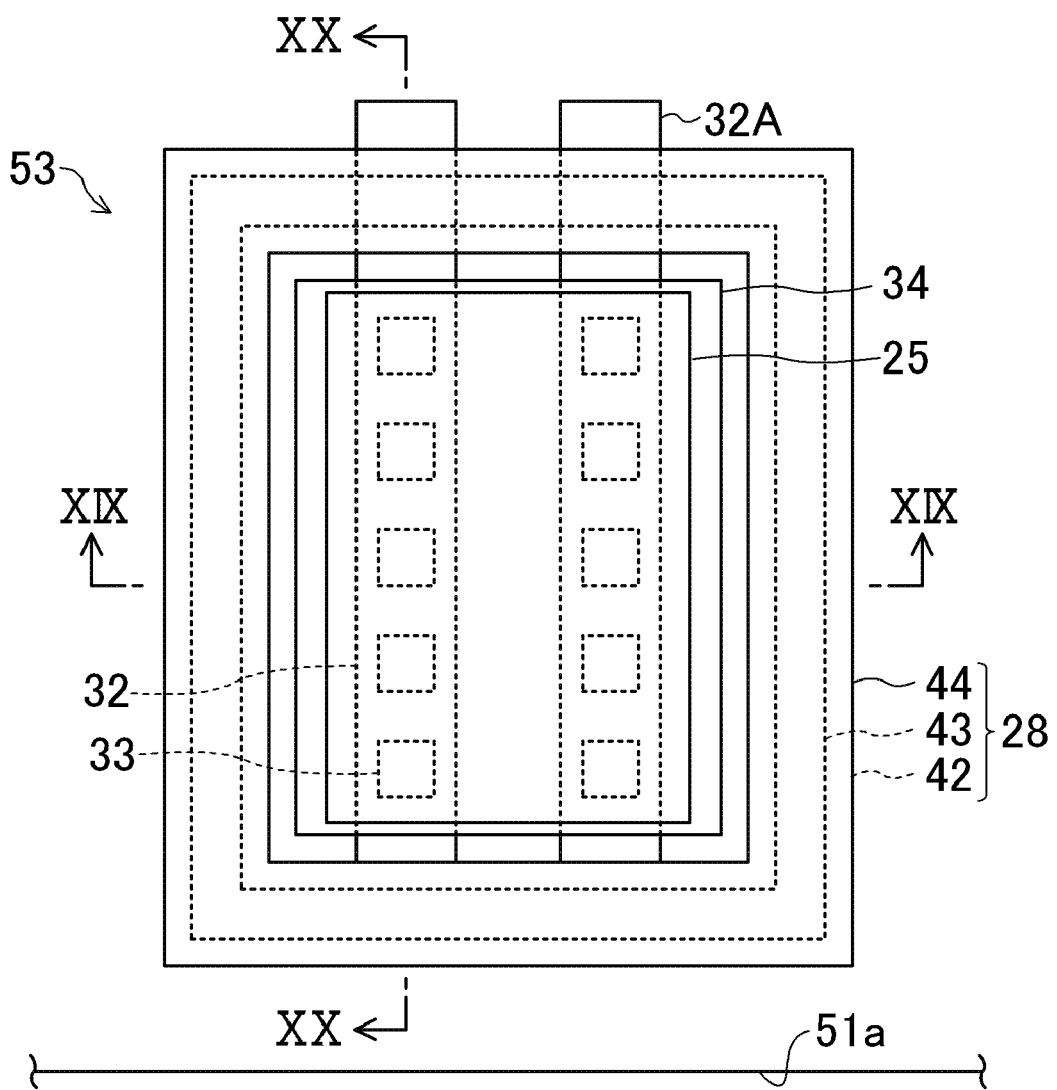
FIG. 18 is a top view of an electrode pad structure in a semiconductor device according to a first variation of the second example embodiment.
Figure 19:
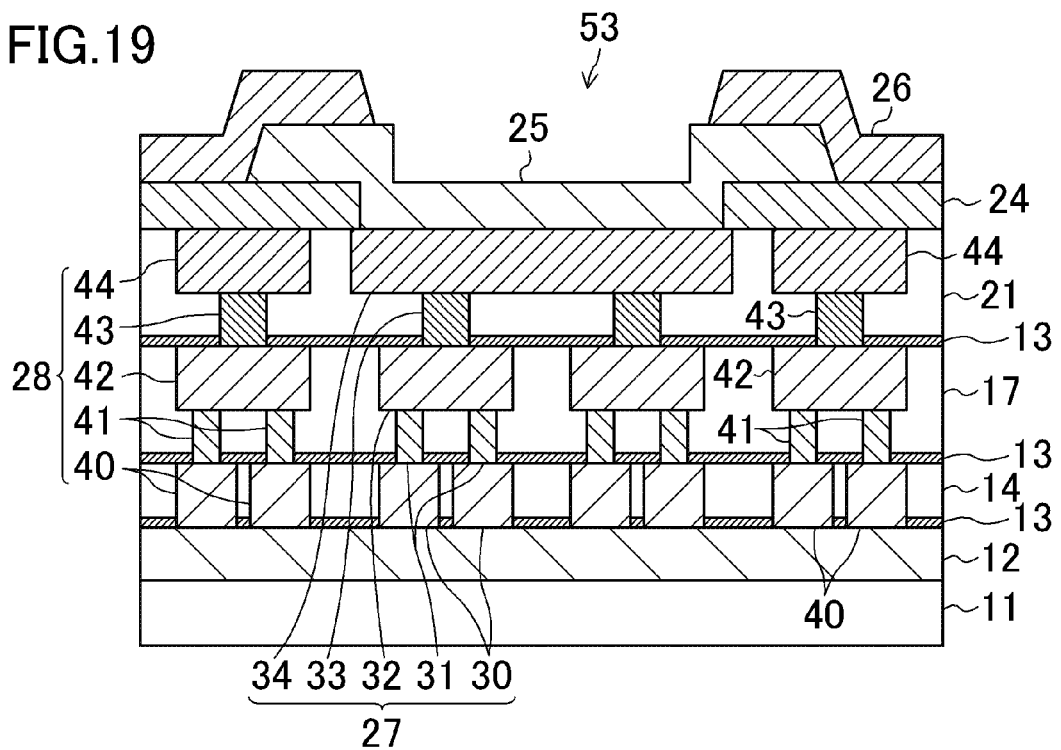
FIG. 19 is a cross-sectional view taken along the line XIX-XIX of FIG. 18.
Figure 20:
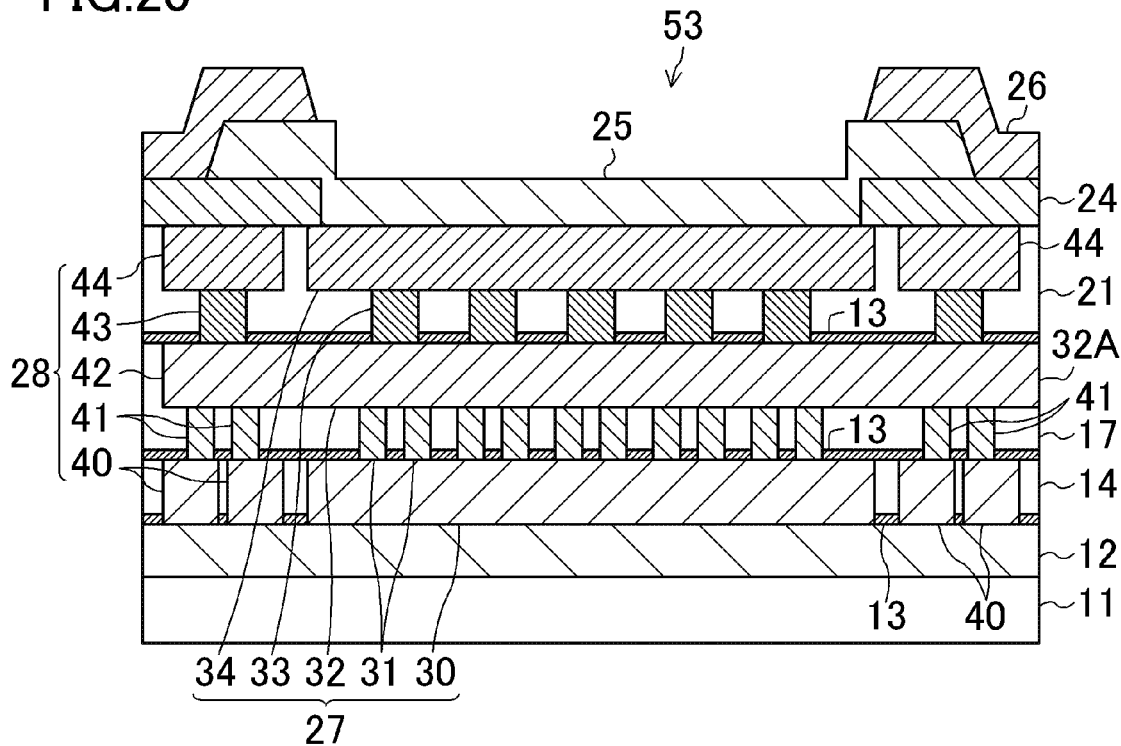
FIG. 20 is a cross-sectional view taken along the line XX-XX of FIG. 18.
Figure 21:
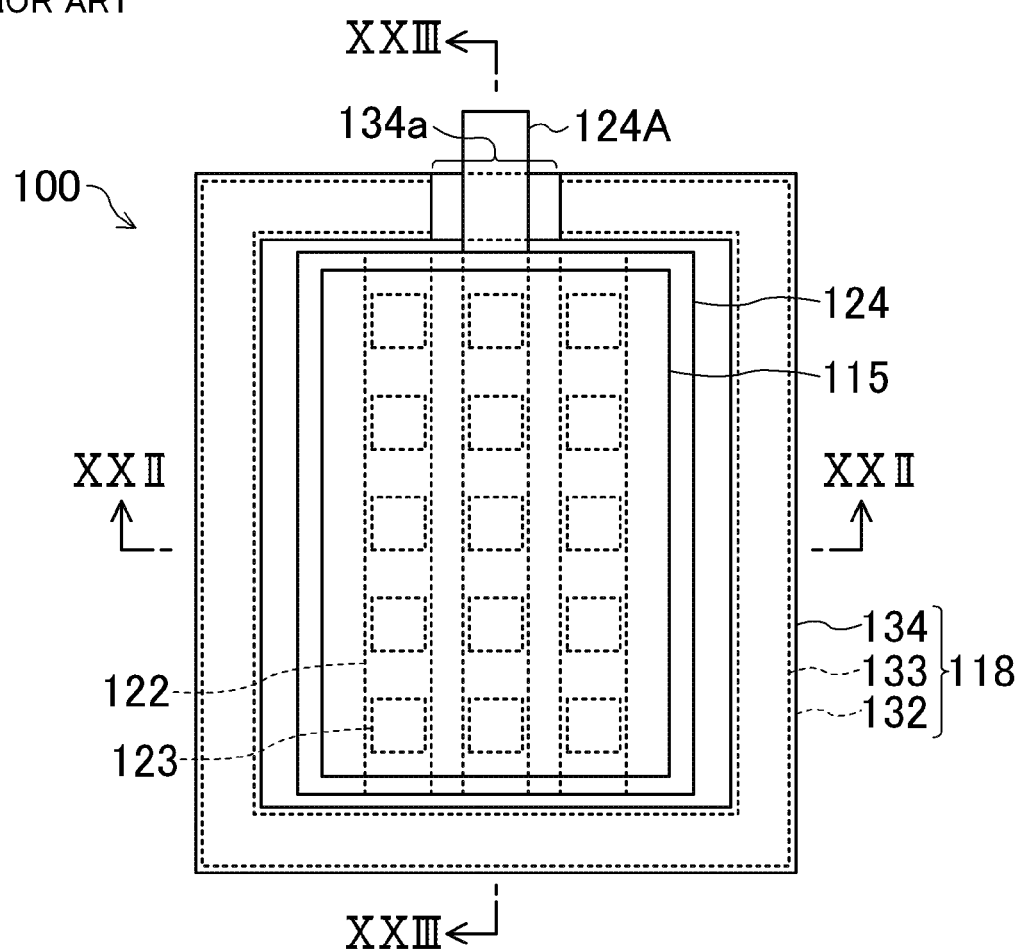
FIG. 21 is a top view of an electrode pad structure in a conventional semiconductor device.
Figure 22:
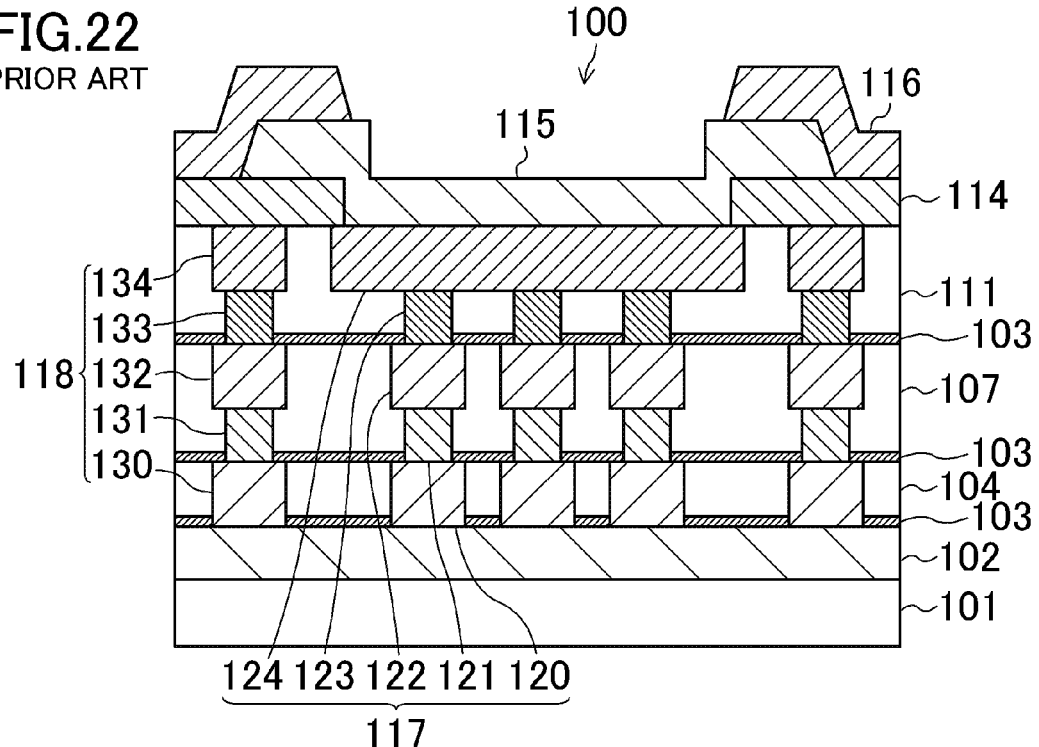
FIG. 22 is a cross-sectional view taken along the line XXII-XXII of FIG. 21.
Figure 23:
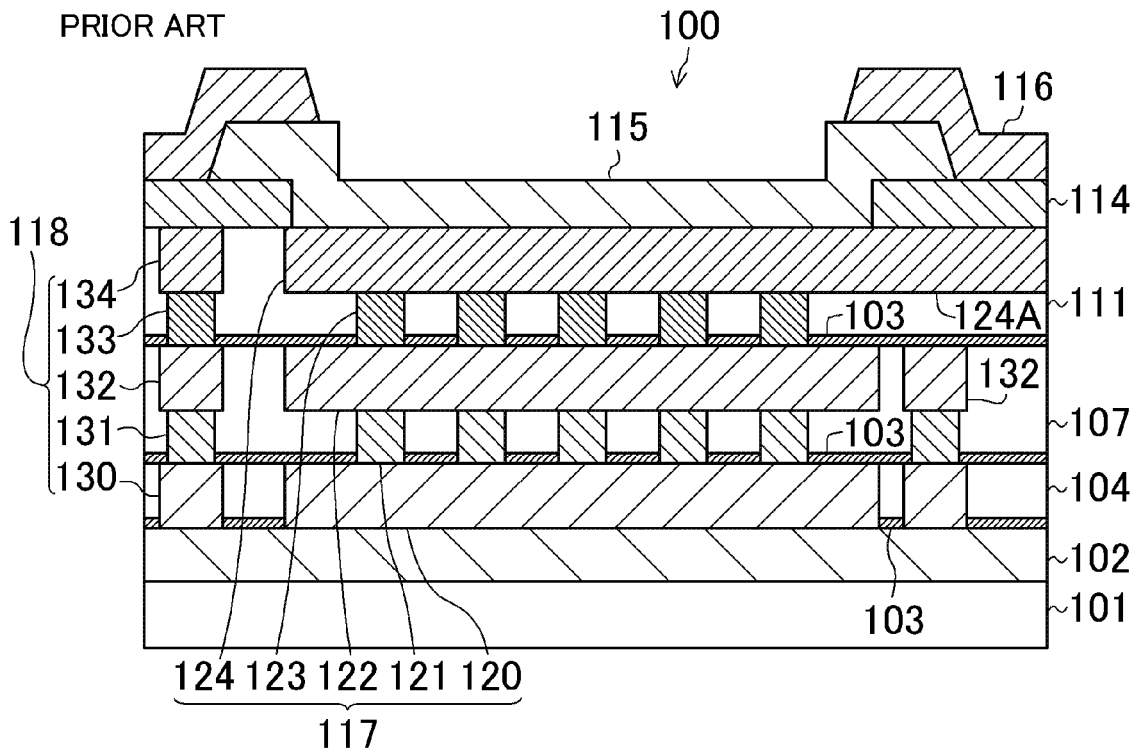
FIG. 23 is a cross-sectional view taken along the line XXIII-XXIII of FIG. 21.

FIGS. 18-20 illustrate an electrode pad structure in a semiconductor according to a first variation of the second example embodiment.

As shown in FIGS. 19 and 20, in the first variation, two fine interconnects extending parallel to each other are used as the first interconnects 30 located lower in the multilayer 27. Similarly, two fine interconnects extending parallel to each other are used as the fourth interconnect 40 located lower in the ring body 28. That is, the number of the lower interconnects is larger than that of the higher interconnects.

In general, fine interconnects are needed in the internal circuit formed in the semiconductor chip 51. Thus, in the first variation, the plurality of fourth interconnects 40 located lower in the ring body 28, which cannot have larger widths than the sixth interconnect 44 and the fifth interconnect 42 located higher, are used.

This structure reinforces the part of the interconnect of the ring body 28 having the smallest width, thereby increasing the advantage of reducing the diffusion of the moisture and of improving the mechanical strength, in the electrode pad structure 53.

Note that, the multilayer 27 is connected to the ring body 28 by the second interconnects 32 in the first and second example embodiments and their variations described above, except for the third variation of the first example embodiment. This structure enables, as described in the first example embodiment, stable electrical connection and an increase in the mechanical strength of the electrode pad structure 53 with respect to the pressure of the probe. Therefore, the connection between the multilayer 27 and the ring body 28 is preferably made by the second interconnects 32. However, not limited to this structure, the multilayer 27 may be connected to the ring body 28 only by the third interconnect 34 or the first interconnects 30.

Also, the connection between the multilayer 27 and the ring body 28 may be made by at least two layers of the first interconnects 30, the second interconnects 32, and the third interconnect 34.

In all of the example embodiments and their variations, the third interconnect 34 connected directly under the connecting portion 25 in the electrode pad structure 53 is in the form of plate. The form is preferably a plate in view of the pressure of the probe etc., but not limited thereto and may be a line or dots.

In the multilayer 27 forming the electrode pad structure 53 and including the connecting portion 25, pluralities of first interconnects 30, second interconnects 32, vias 33, and vias 31 are preferably used, and the number is not limited.

Furthermore, in the multilayer 27, the arrangement direction of the first interconnects 30, the second interconnects 32, and the third interconnect 34 is not limited to the present disclosure, when the lead-out direction of the lead line(s) or the connecting direction with the ring body 28 is not determined.

While examples have been described where the multilayer 27 and the ring body 28 include three interconnect layers, the number is not limited thereto as long as it is two or more.

The first interconnects 30, the vias 31, the second interconnects 32, and the vias 33, which form the multilayer 27 have the same widths as the fourth interconnect 40, the line via 41, the fifth interconnect 42, and the line via 43, which are formed in the corresponding insulating films and in the ring body 28. However, the interconnects and vias in the multilayer 27 may have different widths from those in the ring body 28.

The first protective insulating film 24 and the second protective insulating film 26 are formed on the fourth insulating film 21. The structure is not limited thereto, and a single layer of the first protective insulating film 24, or three or more protective insulating films may be formed.

The planar shape of the ring body 28 is rectangle, but not limited thereto and may be circle, oval, polygon, or the like.

Moreover, the first example embodiment and its variations, and the second example embodiment and its variations can be combined to each other as long as it does not cause any contradiction.

As described above, the semiconductor device according to the present disclosure reduces diffusion of moisture from an electrode pad and corresponds to reduction in the thickness and the dielectric constant of insulating films, and is thus, useful as a semiconductor device etc. having an electrode pad.

What is claimed is:

1. A semiconductor device comprising:
    an electrode pad formed above a semiconductor substrate, and being a connecting portion for an external electrical connection;
    a plurality of insulating films stacked between the semiconductor substrate and the connecting portion;
    a protective film formed on the plurality of insulating films, and having an opening;
    a multilayer body including a plurality of first interconnect layers formed in the plurality of insulating films and including an upper interconnect connected to the electrode pad in the opening of the protective film, and a via configured to connect the first interconnect layers;
    a ring body formed in the plurality of insulating films to surround the multilayer body without interposing space, and including a plurality of second interconnect layers and at least one line via linearly connecting the second interconnect layers; and
    a lead line electrically connecting the connecting portion to an internal circuit, wherein the upper interconnect has a larger width than the opening of the protective film, the multilayer body is electrically connected to the ring body, the lead line is connected to the ring body, and one of the plurality of first interconnect layers is directly connected to one of the plurality of the second interconnect layers.

2. The semiconductor device of claim 1, wherein the lead line is a power supply line, and is connected to an upper interconnect of the plurality of second interconnect layers.

3. The semiconductor device of claim 1, wherein the plurality of first interconnect layers include an interconnect arranged in a form extending in a direction toward the internal circuit.

4. The semiconductor device of claim 3, wherein the one of the plurality of first interconnect layers connected to the ring body is an interconnect being the third layer under the connecting portion.

5. The semiconductor device of claim 1, wherein the plurality of first interconnect layers include an interconnect arranged in a form extending in a direction parallel to an end surface of the semiconductor substrate closest to the electrode pad.

6. The semiconductor device of claim 1, wherein the plurality of first interconnect layers includes a first interconnect arranged in a form extending in a direction toward the internal circuit, and a second interconnect arranged in a form extending in a direction parallel to an end surface of the semiconductor substrate closest to the electrode pad, and the second interconnect is provided lower than the first interconnect.

7. The semiconductor device of claim 1, wherein an upper interconnect of the plurality of second interconnect layers has a larger width than a lower interconnect of the plurality of second interconnect layers.

8. The semiconductor device of claim 1, wherein an outer peripheral surface of an upper interconnect of the plurality of second interconnect layers is located outside an outer peripheral surface of a lower interconnect.

9. The semiconductor device of claim 1, wherein the at least one line via includes an upper line via and a lower line via, and the upper line via has a larger width than the lower line via.

10. The semiconductor device of claim 1, wherein the at least one line via includes an upper line via and a plurality of lower line vias, and the plurality of lower line vias are formed along each other.

11. The semiconductor device of claim 1, wherein a plurality of lower interconnects of the plurality of second interconnect layers are formed along each other.

12. The semiconductor device of claim 1, wherein the plurality of insulating films have different dielectric constants, and an upper insulating film has a higher dielectric constant than a lower insulating film.

13. The semiconductor device of claim 1, wherein part of the plurality of insulating films is formed between the lead line and the upper interconnect connected to the electrode pad.

14. The semiconductor device of claim 1, wherein one of the plurality of second interconnect layers, which is formed in a same layer as the lead line, is formed without interposing space.

15. The semiconductor device of claim 1, wherein the upper interconnect connected to the electrode pad is continuously surrounded by one of the plurality of second interconnect layers formed in a same layer as the upper interconnect.

16. The semiconductor device of claim 15, wherein the upper interconnect connected to the electrode pad, and the interconnect of the plurality of second interconnect layers formed in the same layer as the upper interconnect are separated by part of the plurality of insulating films.

* * * * *